(12) United States Patent
Kim et al.

(10) Patent No.: US 12,372,096 B2
(45) Date of Patent: Jul. 29, 2025

(54) VENTILATING APPARATUS, CIRCUIT ASSEMBLY AND CONTROL METHOD OF THE SAME

(71) Applicant: SAMSUNG ELECTRONICS CO., LTD., Suwon-si (KR)

(72) Inventors: Sangkyoon Kim, Suwon-si (KR); Taehun Kim, Suwon-si (KR); Kiwon Park, Suwon-si (KR); Kongsik Youn, Suwon-si (KR); Seungbeom Lim, Suwon-si (KR); Taeha Jun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/115,482

(22) Filed: Feb. 28, 2023

(65) Prior Publication Data

US 2023/0204042 A1 Jun. 29, 2023

Related U.S. Application Data

(63) Continuation of application No. PCT/KR2021/008449, filed on Jul. 2, 2021.

(30) Foreign Application Priority Data

Aug. 31, 2020 (KR) .................. 10-2020-0110238

(51) Int. Cl.
*H02P 3/06* (2006.01)
*F04D 25/06* (2006.01)
(Continued)

(52) U.S. Cl.
CPC ............. *F04D 27/00* (2013.01); *F04D 25/06* (2013.01); *F24F 11/52* (2018.01); *F24F 11/88* (2018.01);
(Continued)

(58) Field of Classification Search
CPC ....... H02P 3/06; F24F 2013/205; F24F 11/88; F24F 11/52; F24F 13/20; H03K 19/20
See application file for complete search history.

(56) References Cited

U.S. PATENT DOCUMENTS 5,209,075 A 5/1993 Kim
5,823,002 A 10/1998 Jeong
(Continued)

FOREIGN PATENT DOCUMENTS

EP 2 366 958 B1 6/2012
JP 2001-218722 8/2001
(Continued)

OTHER PUBLICATIONS

KR20000008424 translation (Year: 2024).*
(Continued)

*Primary Examiner* — Rina I Duda
(74) *Attorney, Agent, or Firm* — STAAS & HALSEY LLP (57) ABSTRACT

A ventilating apparatus includes a panel, a motor, a circuit assembly, and the apparatus stops an operation of the motor and notify a user when the panel is opened independently of a specific driving condition. The circuit assembly includes a switch which is closed when the panel is coupled to a body, and opened when at least a part of the panel is separated from the body, a motor of which an operation is stopped when the switch is opened, and a microcomputer which is connected to the switch and outputs a notification signal in response to the opening of the switch.

9 Claims, 12 Drawing Sheets (51) Int. Cl.
  *F04D 27/00* (2006.01)
  *F24F 11/52* (2018.01)
  *F24F 11/88* (2018.01)
  *F24F 13/20* (2006.01)
  *F04D 17/00* (2006.01)
  *H03K 19/20* (2006.01)

(52) U.S. Cl.
  CPC ............... *F24F 13/20* (2013.01); *H02P 3/06* (2013.01); *F04D 17/00* (2013.01); *F24F 2013/205* (2013.01); *H03K 19/20* (2013.01)

(56) References Cited

U.S. PATENT DOCUMENTS

| | | | |
|---|---|---|---|
| 6,053,968 A * | 4/2000 | Miller | F24F 8/22 96/16 |
| 9,140,463 B2 | 9/2015 | Jo et al. | |
| 9,425,610 B2 | 8/2016 | Nakashita et al. | |
| 9,447,985 B2 * | 9/2016 | Johnson, Jr. | G05B 15/02 |
| 2013/0162185 A1 | 6/2013 | Higashiyama et al. | |
| 2015/0267929 A1 * | 9/2015 | Kim | F24F 11/30 62/89 |
| 2016/0124399 A1 * | 5/2016 | Su | G05B 11/01 700/275 |
| 2018/0062546 A1 | 3/2018 | Xiang et al. | |
| 2019/0137124 A1 * | 5/2019 | McGarva | F24F 13/0272 |
| 2021/0362771 A1 * | 11/2021 | Ichikawa | H02K 11/33 |

FOREIGN PATENT DOCUMENTS

| | | | |
|---|---|---|---|
| JP | 2002-71194 | 3/2002 | |
| JP | 2006-118741 | 5/2006 | |
| JP | 2006-125732 | 5/2006 | |
| JP | 2009-100611 | 5/2009 | |
| JP | 4425862 | 3/2010 | |
| KR | 10-1992-0009180 | 10/1992 | |
| KR | 10-2000-0008424 | 2/2000 | |
| KR | 20000008424 | * 2/2000 | ............ F24F 1/005 |
| KR | 2001-0061911 | 7/2001 | |
| KR | 10-0739533 | 7/2007 | |

OTHER PUBLICATIONS

International Search Report dated Oct. 21, 2021 issued in PCT/KR2021/008449.

Written Opinion Report dated Oct. 21, 2021 issued in PCT/KR2021/008449.

Office Action dated Apr. 24, 2025 issued in Korean Application No. 10-2020-0110238.

\* cited by examiner

| INPUT | | OUTPUT |
|---|---|---|
| MICROCOMPUTER | SWITCH | |
| 1 | 1 | 1 = DRIVING X |
| 0 | 1 | 1 = DRIVING X |
| 1 | 0 | 1 = DRIVING X |
| 0 | 0 | 1 = DRIVING O |

VENTILATING APPARATUS, CIRCUIT ASSEMBLY AND CONTROL METHOD OF THE SAME

CROSS-REFERENCE TO RELATED APPLICATION

This application is a continuation application, under 35 U.S.C. § 111(a), of International Application No. PCT/KR2021/008449, filed on Jul. 2, 2021, which is based on and claims priority under 35 U.S.C. § 119 to Korean Patent Application No. 10-2020-0110238, filed on Aug. 31, 2020 in the Korean Intellectual Property Office, the disclosure of which is incorporated by reference herein in its entirety.

BACKGROUND

Field

The present disclosure relates to a ventilating apparatus, and a circuit assembly capable of stopping an operation of a motor when a panel is opened, and a control method thereof.

Description of the Related Art

In a product with a built-in fan motor, a panel may be separated from a body even while the product is in operation.

Therefore, the product with the built-in fan motor is generally provided with a safety device between the panel and the body, thereby protecting users from rotation of the motor.

However, the safety device may increase the number and size of parts of the product itself. Also, according to the types of the device, it is difficult to install the safety device.

In recent years, it has been required to ventilate indoor air at regular intervals to remove odors, dust, gas, $CO_2$, etc. from an indoor space. A ventilating apparatus may be used to more quickly discharge the polluted indoor air to the outside and to supply fresh outdoor air to the indoor space while maintaining an indoor temperature. However, it may be difficult to install the safety device described above to the ventilating apparatus.

Therefore, when the panel is opened, it is required for the ventilating apparatus to immediately stop the operation of the fan motor and to prevent the start of the fan motor, and to clearly inform a user of the opening of the panel.

SUMMARY

An embodiment of the present disclosure provides a circuit assembly including a switch configured to be closed based on a panel being coupled to a body, the switch configured to be opened based on at least a part of the panel being separated from the body, a motor configured to be stopped in response to the opening of the switch, and a microcomputer connected to the switch, the microcomputer configured to output a notification signal in response to the opening of the switch.

The circuit assembly may further include an OR gate configured to receive a control signal of the microcomputer and one of an opening signal of the switch and a short signal of the switch.

The OR gate may be configured to recognize the received opening signal as a high signal, and the microcomputer may be configured to output the notification signal in response to receiving the opening signal of the switch.

The OR gate may be configured to output a high signal independently of the control signal in response to the opening of the switch, and an operation of the motor may be stopped based on the high signal outputted by the OR gate.

The microcomputer may be configured to, while the operation of the motor is stopped, determine whether the panel is separated based on a signal transmitted by the switch.

The microcomputer may be configured to, based on a part of the panel being separated from the body while the operation of the motor is stopped, output a notification signal in response to the opening of the switch caused by the separation of the panel.

The circuit assembly may further include a first circuit including the switch, the microcomputer and the OR gate, and a second circuit matched with the first circuit, and the second circuit including the motor.

The first circuit may be a driven circuit which is independent of a control signal outputted by the microcomputer.

The microcomputer may be configured to stop a driving of the motor by transmitting the control signal composed of a high signal to the OR gate, and the first circuit may be a driven circuit.

The first circuit may be connected to a low voltage ground, and the second circuit may be connected to a high voltage ground.

The circuit assembly may further include a photo coupler including a light emitting element included in the first circuit and a light receiving element included in the second circuit. The OR gate may be configured to stop the driving of the motor by outputting a high signal having the same potential as the light emitting element.

An embodiment of the present disclosure provides a control method of a circuit assembly, the control method including recognizing the opening signal as a high signal by an OR gate in response to an opening of a switch caused by at least a part of a panel being separated from a body, stopping an operation of a motor based on the high signal, and outputting a notification signal in response to the recognizing of the opening signal.

The stopping of the operation of the motor may include outputting the high signal by the OR gate independently of the control signal in response to the opening of the switch, and stopping the motor based on the high signal outputted by the OR gate.

The outputting of the notification signal may include, while the operation of the motor is stopped, determining whether the panel is separated based on a signal transmitted by the switch.

The outputting of the notification signal may include, based on one surface of the panel being separated from the body while the operation of the motor is stopped, outputting a notification signal in response to the separation of the panel.

An embodiment of the present disclosure provides a ventilating apparatus including a body, a panel coupled to the body, an alarm arranged in the body or the panel, a switch installed in the body, configured to be closed based on the panel being coupled to the body, and configured to be opened based on at least a part of the panel being separated from the body, a blower fan installed inside the body, a motor configured to rotate the blower fan, and configured to be stopped in response to the opening of the switch, and a microcomputer configured to allow the alarm to output a warning message in response to the opening of the switch.

The microcomputer may be configured to, while the operation of the motor is stopped, determine whether the panel is separated based on a signal transmitted by the switch.

The microcomputer may be configured to, based on one surface of the panel being separated from the body while the operation of the motor is stopped, allow the alarm to output the warning message in response to the opening of the switch caused by the separation of the panel.

DETAILED DESCRIPTION

In the following description, like reference numerals refer to like elements throughout the specification. Well-known functions or constructions are not described in detail since they would obscure the one or more exemplar embodiments with unnecessary detail. Terms such as "unit", "module", "member", and "block" may be embodied as hardware or software. According to embodiments, a plurality of "unit", "module", "member", and "block" may be implemented as a single component or a single "unit", "module", "member", and "block" may include a plurality of components.

It will be understood that when an element is referred to as being "connected" another element, it can be directly or indirectly connected to the other element, wherein the indirect connection includes "connection via a wireless communication network".

Also, when a part "includes" or "comprises" an element, unless there is a particular description contrary thereto, the part may further include other elements, not excluding the other elements.

Throughout the description, when a member is "on" another member, this includes not only when the member is in contact with the other member, but also when there is another member between the two members.

It will be understood that, although the terms first, second, third, etc., may be used herein to describe various elements, but is should not be limited by these terms. These terms are only used to distinguish one element from another element.

As used herein, the singular forms "a," "an" and "the" are intended to include the plural forms as well, unless the context clearly indicates otherwise.

An identification code is used for the convenience of the description but is not intended to illustrate the order of each step. The each step may be implemented in the order different from the illustrated order unless the context clearly indicates otherwise.

Reference will now be made in detail to embodiments of the disclosure, examples of which are illustrated in the accompanying drawings.

The present disclosure is directed to providing a ventilating apparatus and a circuit assembly capable of, in a device provided with a panel and a motor, stopping an operation of the motor in response to opening the panel, independently of certain driving conditions and capable of informing a user of the opening of the panel, and a control method thereof.

A ventilating apparatus, a circuit assembly and a control method thereof may, in a device provided with a panel and a motor, stop an operation of the motor in response to opening the panel, independently of certain driving conditions, and inform a user of the opening of the panel. Accordingly, it is possible to improve the safety of the device.

A ventilating apparatus, a circuit assembly and a control method thereof may, in a device provided with a panel and a motor, stop an operation of the motor in response to opening the panel, independently of certain driving conditions, and inform a user of the opening of the panel. Accordingly, it is possible to improve the safety of the device.

Figure 1:
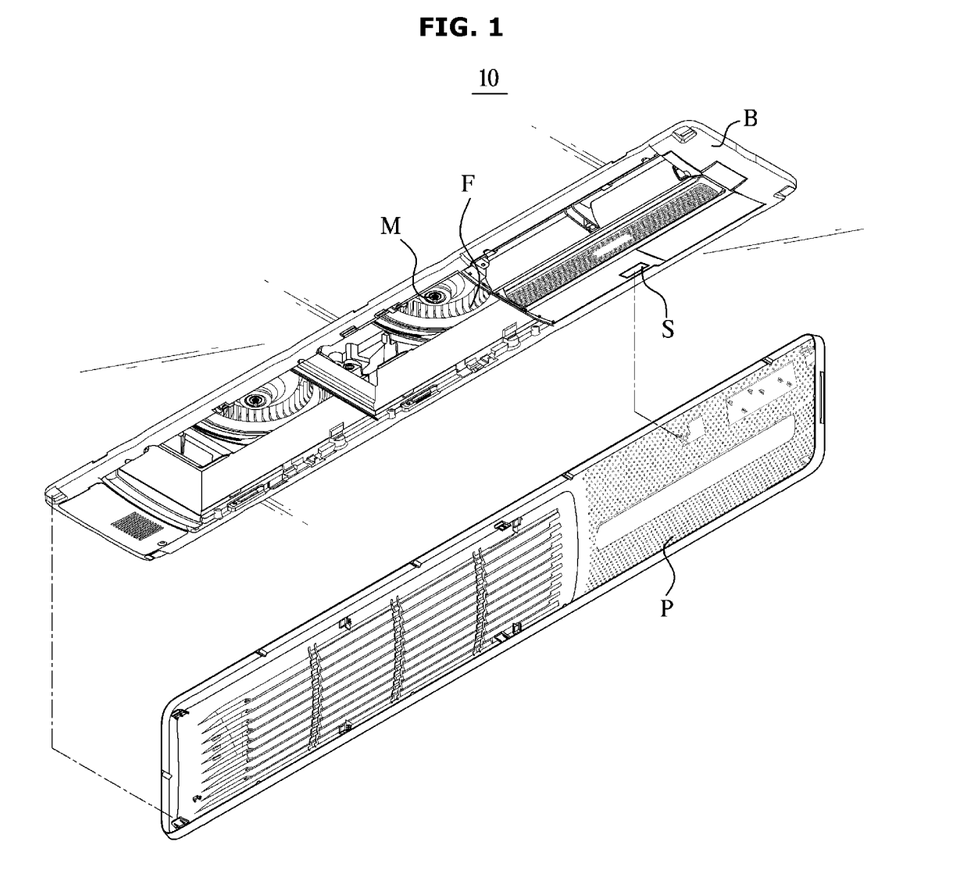
FIG. 1 is a view of a ventilating apparatus according to an embodiment of the present disclosure.

FIG. 1 is a view of a ventilating apparatus 10 according to an embodiment of the present disclosure.

The ventilating apparatus 10 may ventilate indoor air at regular intervals in order to remove odors or dust from an indoor space. The ventilating apparatus may more quickly exhaust polluted indoor air to an outdoor space and supply fresh outdoor air to the indoor space while maintaining an indoor temperature.

The ventilating apparatus 10 may include a body B, and a panel P and a motor M arranged inside the body. The motor may be connected to a blower fan F.

The panel P may be detachably provided on the body. According to an embodiment, the panel may be rotatable with a shaft provided in the body.

The motor M provided in the body B may rotate the fan F. The motor may be fixed to the body. As for the ventilating apparatus, the panel may be separated from the body in certain circumstances. In response to the panel being separated, it is required to stop the operation of the motor for safety. Hereinafter an operation of stopping the motor in response to the separation of the panel and further informing the stop of the motor in the ventilating apparatus will be described.

According to an embodiment, a switch S may be used to stop the motor.

Although the description is described based on the ventilating apparatus, there is no limitation in a device configured to stop a motor when a panel is separated from a body. That is, a circuit assembly described below may be used in the ventilating apparatus, but is not limited thereto as long as a device includes a motor and provided to allow a panel to be separated from a body.

Figure 2:
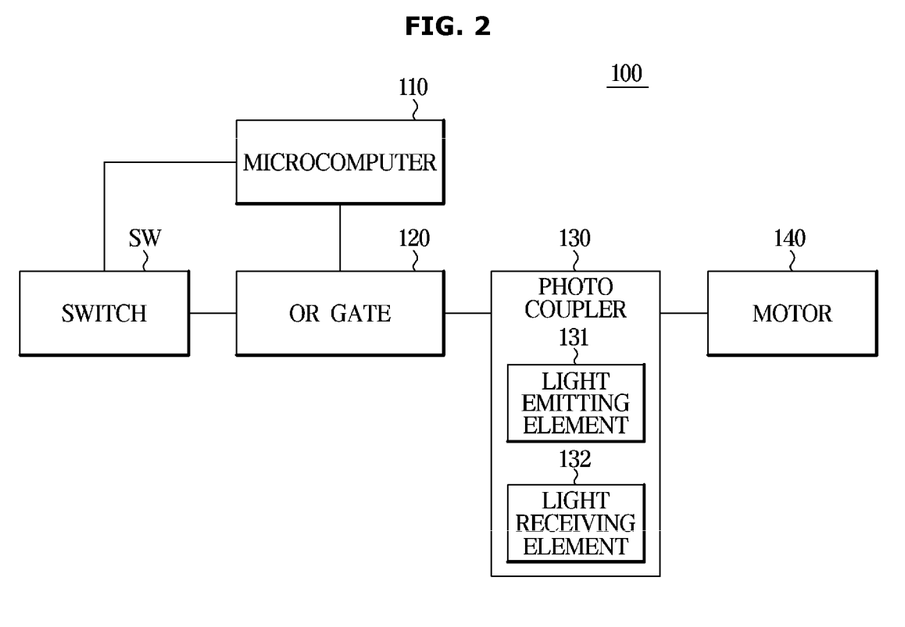
FIG. 2 is control block diagram of a circuit assembly according to an embodiment of the present disclosure.
Figure 3:
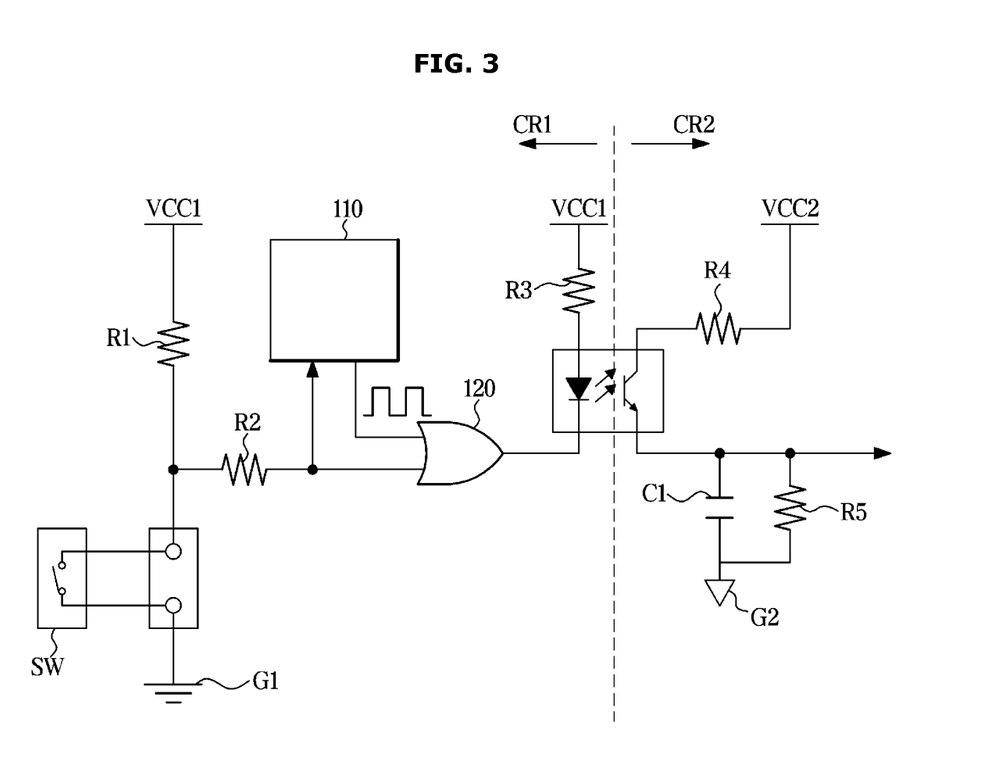
FIG. 3 is a circuit diagram of the circuit assembly according to an embodiment of the present disclosure.

FIG. 2 is control block diagram of a circuit assembly according to an embodiment of the present disclosure, and FIG. 3 is a circuit diagram of the circuit assembly according to an embodiment of the present disclosure.

The circuit assembly 100 according to an embodiment may include a switch SW, a microcomputer 110, an OR gate 120, a photo coupler 130 and a motor 140.

Additionally, the circuit assembly may include resistors R1, R2, R3, R4, and R5 and a capacitor C1.

The switch SW may be opened or shorted depending on a position of the panel.

The switch SW may be provided as a mechanical switch, but may also be provided as a sensor configured to detect a magnetic field. Accordingly, there is no limitation in the switch as long as a switch is configured to control a circuit of the ventilating apparatus.

The motor 140 may be arranged on the body and connected to the fan.

An alarm may be provided as a device configured to output a notification signal to be described later. The alarm may be provided as a visual output device such as a light emitting diode (LED) lamp and a display, and also provided as an auditory output device such as a speaker.

When the switch is opened as one surface of the panel is separated from the body, the operation of the motor may be stopped.

The microcomputer 110 may output a notification signal in response to the opening of the switch SW. The output notification signal may transmit a warning message to a user through the alarm. The OR gate 120 may be configured to receive an output signal of the microcomputer 110 and a signal of the switch.

The alarm may be provided as a device configured to output a notification signal. According to an embodiment, the alarm may be provided on the body or the panel of the ventilating apparatus. The alarm may be provided as a visual output device such as an LED lamp and a display, and also provided as an auditory output device such as a speaker.

The OR gate 120 may be one of basic logic gates for configuring all logic functions, and may mean a configuration implementing logical addition.

The OR gate 120 may recognize an opening signal corresponding to the opening of the switch, as a high signal.

That is, the OR gate 120 may receive a signal outputted from the microcomputer and a signal of the switch as two inputs.

At this time, the OR gate may recognize an open state of the switch as a high signal and a short state of the switch as a low signal.

The microcomputer may output the notification signal in response to receiving the opening signal.

That is, the switch SW may be connected to the microcomputer and the microcomputer may receive the signal that the switch is opened. The microcomputer may output the notification signal in response to the determination that the switch is opened.

When the switch is opened, the OR gate 120 may output a high signal independently of the control signal outputted from the microcomputer. That is, when the switch SW is opened, a signal may be input to the OR gate, and the signal, which is input when the switch is opened, may be input as a high signal.

Therefore, the OR gate may output a high signal regardless of the signal outputted by the microcomputer.

That is, the OR gate 120 may receive a switch open signal as a high signal when the switch is opened, and the OR gate 120 may maintain an on-state regardless of a control signal outputted from the microcomputer. The motor 140 may be stopped based on the high signal outputted by the OR gate.

A detailed description in which the motor is stopped by a signal outputted by the OR gate 120 will be described later.

In a state in which the operation of the motor 140 is stopped, the microcomputer 10 may determine whether the panel is separated, based on the signal transmitted by the switch SW.

Particularly, when one surface of the panel is separated from the body in the state in which the operation of the motor 140 is stopped, the microcomputer 10 may output a notification signal in response to the separation of the panel.

That is, when the panel is opened in the state in which the motor drives, the microcomputer 110 may stop the operation of the motor and output the notification signal. Further, when the panel is opened in the state in which the motor does not drive, the microcomputer 110 may detect the opening of the panel and output the notification signal.

A first circuit CR1 including the aforementioned switch SW, microcomputer 110 and OR gate 120 may be formed.

A second circuit CR2 including the motor may be formed and the second circuit may be matched with the first circuit.

The first circuit may be provided as a driven circuit regardless of the control signal outputted by the microcomputer. A driven circuit may mean a circuit in which both input and output operate normally, and may mean a state in which the circuit is not floating.

That is, when the panel is separated from the body, the switch may be opened, and the OR gate may receive the switch open signal as the high signal, and the circuit may be maintained as the driven circuit regardless of the signal outputted by the microcomputer.

That the microcomputer 110 does not output the motor control signal may mean that the motor is stopped, and thus the first circuit may be provided as a driven circuit in the state in which the operation of the motor is stopped.

The first circuit CR1 including the switch and the microcomputer may be connected to a low voltage ground, and the second circuit CR2 may be connected to a high voltage ground.

The first circuit CR1 and the second circuit CR2 may be matched by the photo coupler 130. Particularly, the photo coupler 130 may include a light emitting element 131 included in the first circuit CR1 and a light receiving element 132 included in the second circuit.

The photo coupler 130 includes the light emitting element 131 and the light receiving element 132. When a signal is input to the light emitting element, the light emitting element may emit light and when the light is incident to the light receiving element that is a photo transistor, the photo coupler 130 may be a conductive state.

At least one component may be added or deleted in accordance with the performance of the components of the circuit assembly shown in FIGS. 2 and 3. In addition, it should be understood by those skilled in the art that the mutual positions of the components may be changed in accordance with the performance or structure of the system.

Each component shown in FIGS. 2 and 3 means software and/or hardware components such as a Field Programmable Gate Array (FPGA) and Application Specific Integrated Circuit (ASIC).

Figure 4:
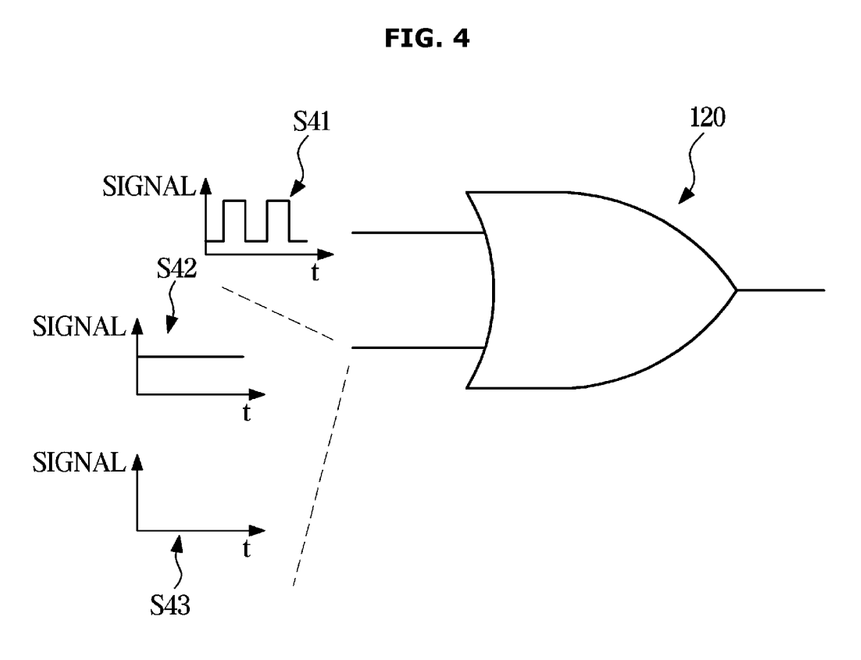
FIGS. 4 and 5 are views illustrating an operation of an OR gate according to an embodiment of the present disclosure.
Figure 5:
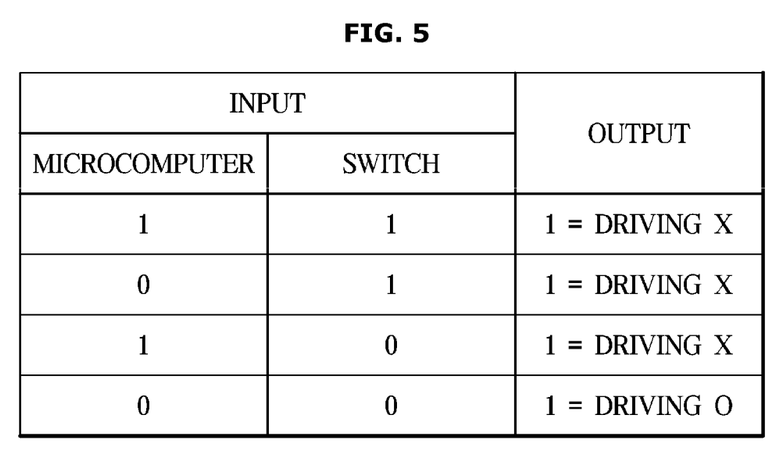

FIGS. 4 and 5 are views illustrating an operation of the OR gate according to an embodiment of the present disclosure.

The OR gate 120 described in the present disclosure may be provided as a configuration configured to receive an output signal of the microcomputer and a signal of the switch.

The OR gate is one of the basic logic gates for configuring all logic functions, and may mean a configuration implementing the logical addition.

That is, the OR gate may receive a control signal S41 for controlling the motor by the microcomputer, and signals S42 and S43 of the switch.

As for the control signal outputted by the microcomputer, the microcomputer may output a signal, in which a low signal and a high signal are repeated so as to form a duty, when the microcomputer controls the motor.

Particularly, the output signal S41 for controlling the motor by the microcomputer is a signal for the microcomputer to control the operation of the motor, and according to an embodiment, the output signal may be implemented as a PWM signal. That is, the output signal outputted by the microcomputer may be recognized as a high signal "1" and a low signal "0" depending on the signal.

The microcomputer may change the operation of the motor by changing the duty of the PWM signal. The output signal S41 outputted from the microcomputer may be input as a high signal or a low signal to the OR gate according to the input signal.

When stopping the operation of the motor, the microcomputer may output a control signal composed of only a high signal.

The OR gate 120 may recognize the signal of the switch. Particularly, the OR gate 120 may recognize the opening signal S42, in which the switch is opened, as a high signal, that is "1", and the short signal S43, in which the switch is short-circuited, as a low signal, that is "0".

The microcomputer may recognize the opening signal S42 of the switch and output a notification signal.

Referring to FIGS. 4 and 5 together, when the panel is separated from the body and the switch is opened, the switch may input the high signal S42, that is, "1" to the OR gate. In this case, regardless of the signal outputted by the microcomputer, the OR gate may output a high signal, and stop the operation of the motor based on the high signal. A detailed operation of stopping the driving of the motor will be described later.

Accordingly, when the switch is opened, the OR gate may output the high signal independently of the control signal output by the microcomputer.

That is, when the switch is opened, the OR gate may output the high signal regardless of the output signal S41 of the microcomputer because the OR gate recognizes the opening signal S42 of the switch as the high signal. The operation of the motor may be stopped based on the OR gate outputting the high signal. On the other hand, when the switch is short-circuited because the panel is not separated from the body, the switch may output the low signal S43. Therefore, when the signal outputted by the microcomputer is the high signal, the driving of the motor may be stopped. On the other hand, when the signal outputted by the microcomputer is the low signal, the OR gate may output the low signal, and thus the motor may be driven.

A detailed operation, in which the motor is driven when the signal outputted by the OR gate is the low signal and the driving of the motor is stopped when the signal outputted by the OR gate is the high signal, will be described later.

The operation of the OR gate described in FIGS. 4 and 5 is only an embodiment of the present disclosure, and there is no limitation in the practice of the present disclosure as long as the motor is driven when the switch is opened.

Figure 6A:
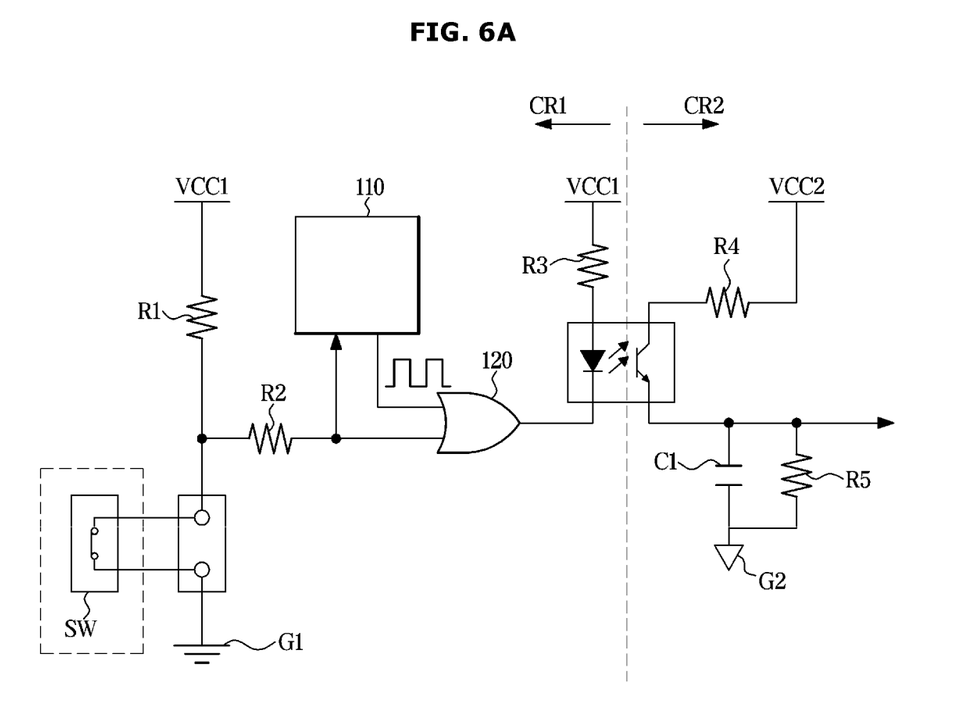
FIG. 6A is a view illustrating an operation of the present disclosure in a state in which a switch according to an embodiment is short-circuited.
Figure 6B:
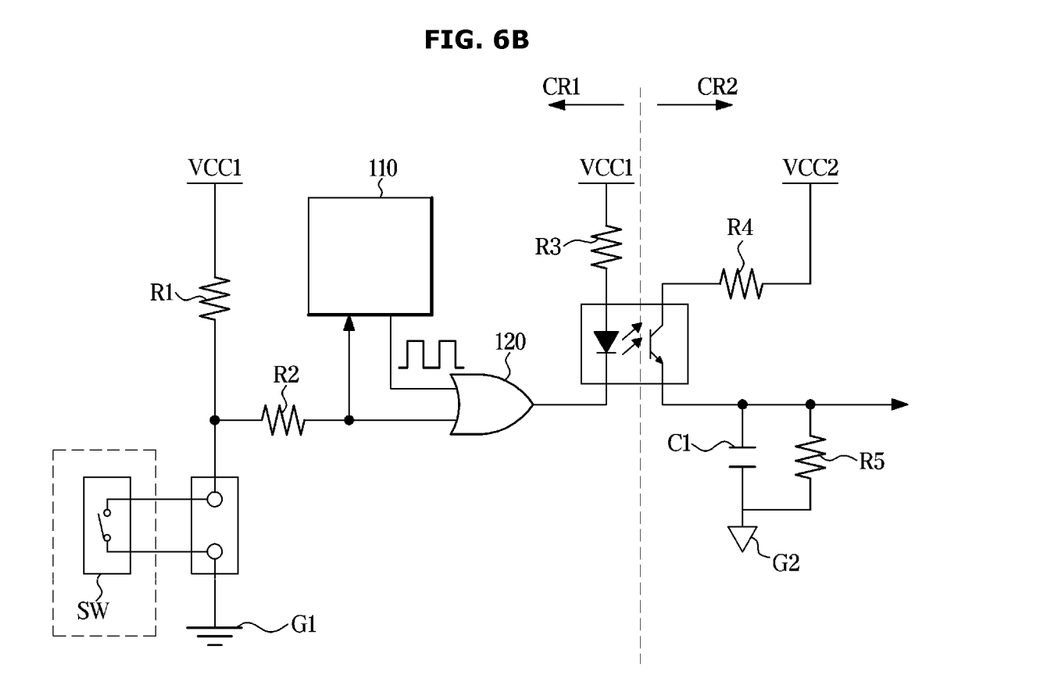
FIG. 6B is a view illustrating an operation of the present disclosure in a state in which the switch according to an embodiment is opened.
Figure 7:
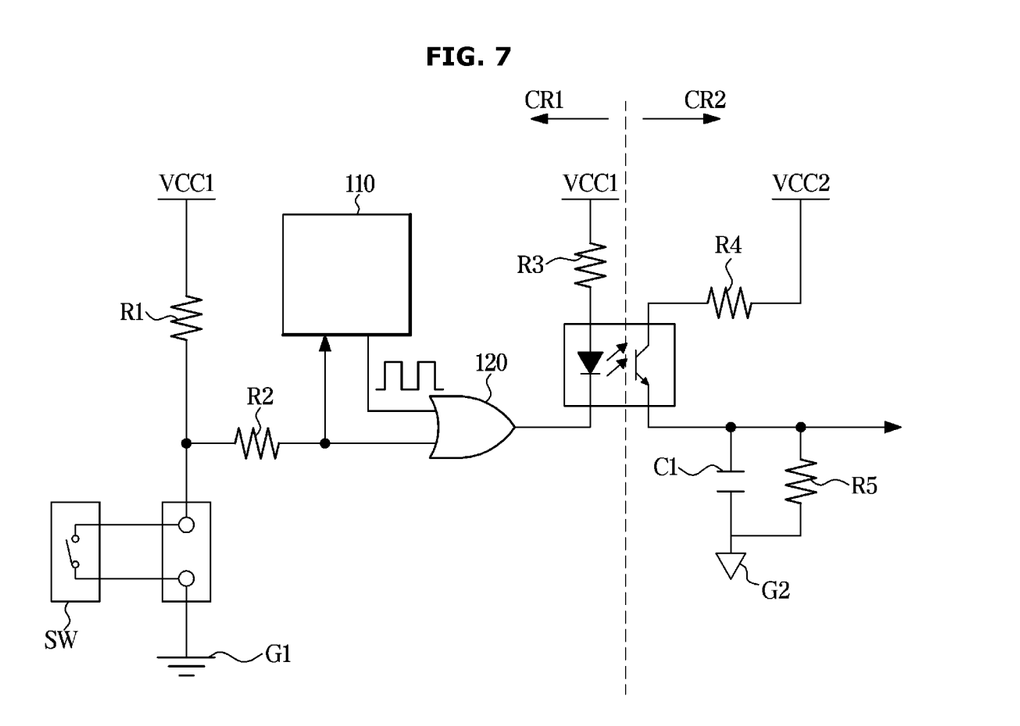
FIG. 7 is a view illustrating a first circuit and a second circuit according to an embodiment of the present disclosure.

FIGS. 6A and 6B are views illustrating an operation of the present disclosure based on a flow of signal, and FIG. 7 is a view illustrating the first circuit and the second circuit according to an embodiment of the present disclosure.

Referring to FIG. 6A, when the panel is not separated, power may be supplied to the circuit assembly 100, and because the switch SW is short-circuited, the switch may transmit a low signal.

When the panel is not separated, the OR gate 120 may receive the low signal from the switch SW, and thus the OR gate may repeatedly output the high signal and the low signal according to the control signal outputted by the microcomputer.

The high signal outputted by the OR gate may be equal to VCC1 supplied to the circuit assembly.

Therefore, when the signal outputted from the OR gate is the high signal, a potential of a point of VCC1 and a potential of an output terminal of the OR gate are the same, and thus a current does not flow.

Accordingly, the motor may not operate because the light emitting element 131 of the photo coupler does not emit light.

On the other hand, when the low signal is outputted from the OR gate, a difference between the potential of the point of VCC1 and the potential of the output terminal of the OR gate may be generated and thus a current may flow. Accordingly, the light emitting element 131 of the photo coupler may operate and thus the motor may operate.

Referring to FIG. 6B, when the panel is separated, the OR gate 120 may recognize the opening signal of the switch SW as the high signal.

The microcomputer 110 may receive the high signal and output the notification signal.

As described above, the notification signal may be transmitted to and outputted through the alarm, and the alarm may be provided in the body of the ventilating apparatus or the like. In addition, the alarm may be provided with a configuration configured to output a visual signal or a configuration configured to output an audible signal. There is no limitation in the type of the configuration as long as the alarm is configured to inform a user of the opening of the panel.

When the switch SW is opened, the switch may transmit the high signal to the OR gate 120, and thus the OR gate 120 may output the high signal regardless of the signal outputted by the microcomputer. As described above, when the OR gate 120 outputs the high signal, the OR gate may output a signal having the same potential as VCC1. In this case, a current may not flow to the motor because a current does not flow through the light emitting element of the photo coupler.

Referring to FIGS. 6A, 6B and 7 together, the switch, the microcomputer and the OR gate may form the first circuit CR1, and the circuit including the motor may form the second circuit CR2.

The first circuit CR1 may be connected to the low voltage ground G1 or SGND, and the second circuit CR2 may be connected to the high voltage ground G2 or PGND.

Even when the motor is not driven before the panel is separated from the ventilating apparatus or circuit assembly, the microcomputer 110 may detect the separation of the panel.

That is, a state in which a user stops the operation of the motor, or a state in which the operation of the motor is not required, the microcomputer may not output a control signal. That is, the microcomputer may output only the high signal, not the control signal including the repeated high signal and low signal. When the control of the motor is operated, the OR gate 120 may receive the high signal transmitted by the microcomputer 110 and output the high signal. The output high signal may be formed at the same potential as VCC1 and thus the light emitting element 131 may not emit light.

However, even in this case, when the panel is separated and the switch is opened, the switch SW may transmit the high signal to the OR gate 120, and the OR gate 120 may output the high signal. Therefore, according to the present disclosure, even in the state in which the motor is not driven, the microcomputer may determine whether the panel is separated based on the signal transmitted by the switch and output the notification signal based on the determined signal.

The first circuit may not be floating because the OR gate outputs the high signal.

That is, the first circuit may be provided as the driven circuit because the OR gate is not turned off regardless of the control signal outputted by the microcomputer 110.

In summary, when the panel is separated from the body in the state in which the operation of the motor is stopped, the OR gate may output the high signal and the first circuit CR1 may be provided as the driven circuit. Therefore, the microcomputer 110 may detect the separation of the panel. Referring to FIG. 7, the first circuit CR1 and the second circuit CR2 may be matched through the photo coupler 130.

Particularly, the photo coupler 130 may include the light emitting element 131 and the light receiving element 132.

According to the present disclosure, the light emitting element may be provided in the first circuit CR1 and the light receiving element in the second circuit CR2. The light emitting element 131 and the light receiving element 132 are electrically insulated, but a signal may be transmitted by light.

According to the present disclosure, a voltage of VCC1 is applied to the first circuit CR1 and thus when the panel is separated from the body and the switch is opened and the high signal is outputted from the OR gate, a voltage having the same potential as VCC1 may be outputted. Accordingly, a current may not flow in the circuit including the light emitting element. In this case, the light emitting element 131 included in the first circuit does not emit light. Accordingly, the light receiving element 132 does not receive light, and thus the operation of the motor is stopped.

However, when the switch is not opened and the microcomputer outputs the control signal, the OR gate may output the high signal and the low signal based on the output signal outputted by the microcomputer. When the OR gate outputs the low signal, a potential difference with VCC1 may be generated, and because a current flows through the light emitting element of the first circuit, the light emitting element may emit light. The light receiving element of the second circuit may receive the light and because the current flows, the motor may be driven.

According to an embodiment, the light emitting element may be provided as a light emitting diode, and the light receiving element may be provided as a photo transistor.

The circuit diagrams disclosed in FIGS. 6A, 6B, and 7 are merely circuit diagrams of an embodiment of the present disclosure, and there is no limitation in the type of the circuit as long as the circuit is configured to detect the separation of the panel and configured to stop the motor.

Figure 8:
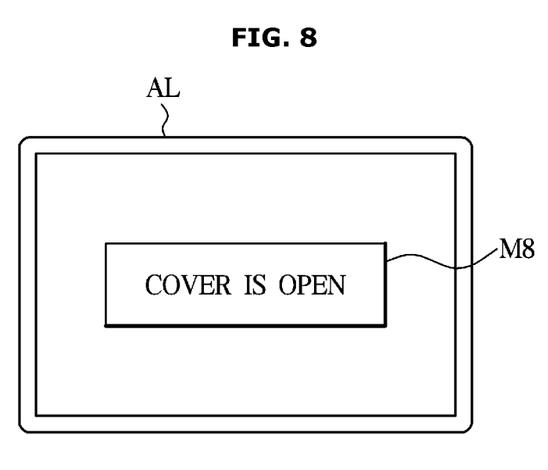
FIG. 8 is a view illustrating an operation of outputting a warning message according to an embodiment of the present disclosure.

FIG. 8 is a view illustrating an operation of outputting a notification signal according to an embodiment of the present disclosure.

Referring to FIG. 8, when the panel is separated from the body, the switch may be opened, and the microcomputer may receive the signal that the switch is opened, as described above.

That is, when the panel is separated from the body, the switch may be opened and the OR gate may recognize the corresponding signal as the high signal. The signal may be detected by the microcomputer and the microcomputer may determine that the panel is separated.

When the microcomputer determines that the panel is separated based on the signal transmitted by the switch, the microcomputer may transmit the notification signal to the alarm AL.

The alarm AL may receive the notification signal and output a warning message M8.

According to an embodiment, the alarm AL may be provided as a display provided on one surface of the body of the ventilating apparatus.

According to an embodiment, the warning message M8 may be output as a text such as "cover is open".

In the description, it is illustrated that the alarm AL is provided as a display, but is not limited thereto. Alternatively, the alarm AL may be provided as a light emitting device configured to emit light, such as a light emitting diode (LED) and an auditory output device such as a speaker.

The microcomputer may output the notification signal when the panel is separated in both states in which the motor is driven and in which the driving of the motor is stopped.

When the panel is separated in the state in which the motor is driven, the microcomputer may output the control signal and input the control signal to the OR gate. Because the switch is opened and the high signal is outputted, the above-described first circuit may be driven and thus the microcomputer may output the notification signal.

When the panel is separated in the state in which the driving of the motor is stopped, the microcomputer may not output the control signal and the low signal may be input to the OR gate. Because the switch is opened and the high signal is transmitted to the OR gate, the OR gate may output the high signal. Accordingly, the above-described first circuit may be driven and the microcomputer may detect the opening of the switch and output the notification signal.

The operation of the alarm described in FIG. 8 is only an embodiment of the present disclosure, and thus there is no limitation in the operation of the alarm as long as the alarm is configured to inform a user of the separation of the panel.

Figure 9:
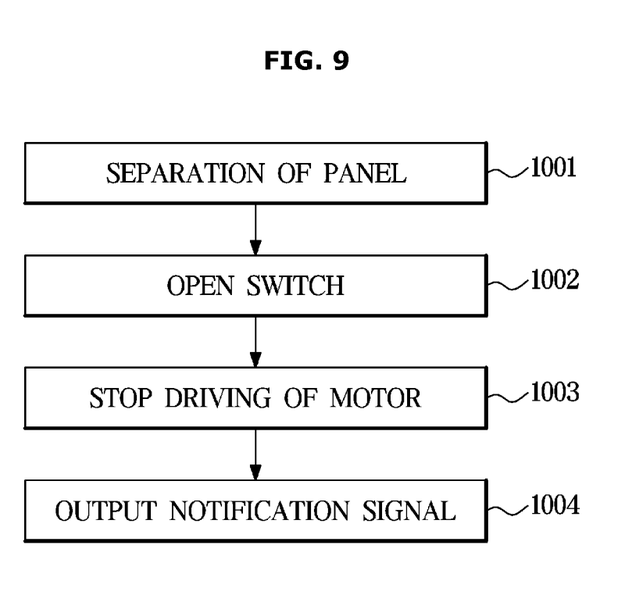
FIGS. 9 to 11 are flowcharts according to an embodiment of the present disclosure.
Figure 10:
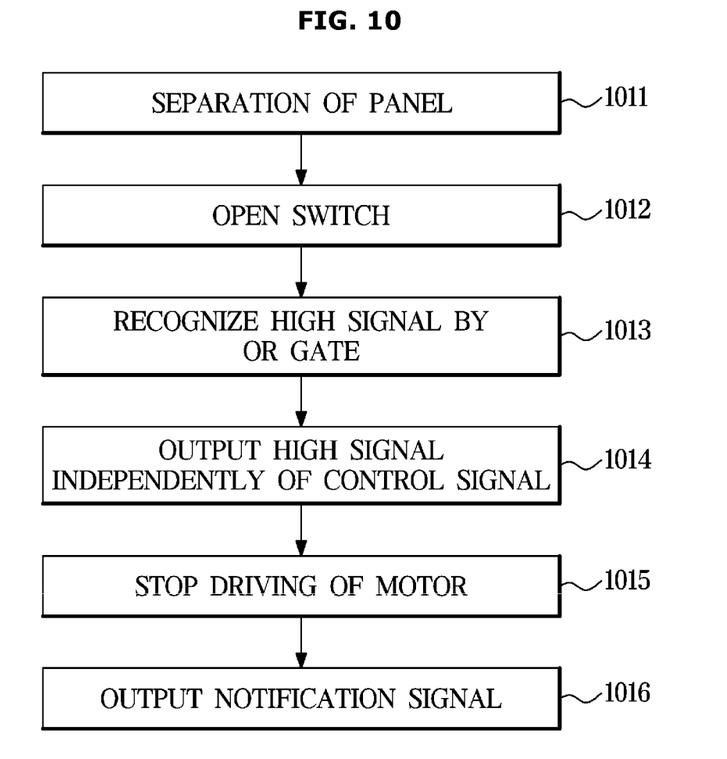
Figure 11:
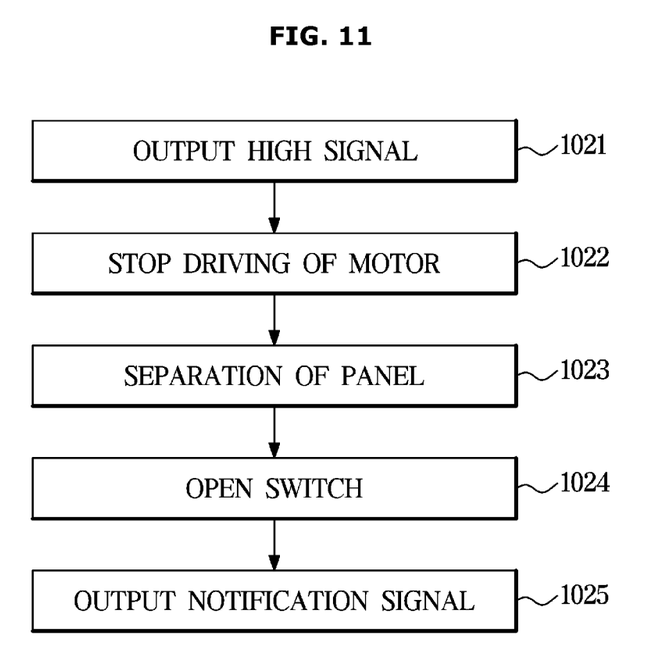

FIGS. 9, 10 and 11 are flowcharts according to an embodiment of the present disclosure.

Referring to FIG. 9, when the panel of the ventilating apparatus is separated (1001), the switch of the circuit assembly may be opened (1002), and when the switch is opened, the operation of the motor may be stopped (1003).

When the operation of the motor is stopped, the notification signal may be output (1004).

FIG. 10 is a flowchart illustrating the operation of FIG. 9 in terms of signals of the circuit assembly.

Referring to FIG. 10, when the panel is separated (1011), the switch may be opened (1012).

When the switch is opened, the OR gate may receive the opening signal of the switch as the high signal (1013).

As the OR gate receives the high signal due to the opening of the switch, the OR gate may output the high signal. Accordingly, the OR gate may output the high signal independently of the control signal (1014).

When the high signal is outputted, the potential difference with the voltage in the circuit terminal may be equal, and thus the current may not flow, and the operation of the motor may be stopped (1015).

In addition, the operation of the motor is stopped and the microcomputer may output the notification signal to the alarm based on the opening signal of the switch (1016).

FIG. 11 is a flowchart illustrating an operation of outputting the notification signal in the state in which the motor is stopped.

Referring to FIG. 11, in order for the microcomputer to stop the operation of the motor, the microcomputer may output the signal including the high signal (1021). When the microcomputer outputs the high signal, the OR gate may output the high signal and thus the operation of the motor may be stopped (1022).

When the panel is separated and the switch is opened (1023 and 1024), the microcomputer may recognize the separation of the panel and the opening of the switch and output the notification signal (1025) because the corresponding circuit is not in the floating state.

Meanwhile, the disclosed embodiments may be embodied in the form of a recording medium storing instructions executable by a computer. The instructions may be stored in the form of program code and, when executed by a processor, may generate a program module to perform the operations of the disclosed embodiments. The recording medium may be embodied as a computer-readable recording medium.

The computer-readable recording medium includes all kinds of recording media in which instructions which can be decoded by a computer are stored. For example, there may be a Read Only Memory (ROM), a Random Access Memory (RAM), a magnetic tape, a magnetic disk, a flash memory, and an optical data storage device.

While the present disclosure has been particularly described with reference to exemplary embodiments, it should be understood by those of skilled in the art that various changes in form and details may be made without departing from the spirit and scope of the present disclosure.

What is claimed is:

1. A circuit assembly for a ventilating apparatus, comprising:
   a first circuit comprising:
      a switch configured to be closed based on a panel being coupled to a body of the ventilating apparatus, the switch configured to be opened based on at least a part of a panel of the ventilating apparatus being separated from the body;
      a microcomputer connected to the switch, the microcomputer configured to output a control signal, and to output a notification signal in response to an opening of the switch;
      an OR gate configured to receive:
         the control signal of the microcomputer; and
         one of an opening signal of the switch and a short signal of the switch;
   a second circuit matched with the first circuit, the second circuit comprising:
      a motor configured to be stopped in response to the opening of the switch; and
   a photo coupler comprising a light emitting element included in the first circuit and a light receiving element included in the second circuit, the first circuit and the second circuit being matched by the photo coupler,
   wherein the control signal includes a signal to stop an operation of the motor, and
   the motor is configured to be stopped based on an output signal of the OR gate.

2. The circuit assembly of claim 1, wherein
   the OR gate is configured to recognize the received opening signal as a high signal, and the microcomputer is configured to output the notification signal in response to receiving the opening signal of the switch.

3. The circuit assembly of claim 1, wherein
   the OR gate is configured to output a high signal independently of the control signal in response to the opening of the switch, and
   the operation of the motor is stopped based on the high signal outputted by the OR gate.

4. The circuit assembly of claim 1, wherein
   the microcomputer is configured to, while the operation of the motor is stopped, determine whether the panel is separated based on the opening signal and the short signal transmitted by the switch.

5. The circuit assembly of claim 4, wherein
   the microcomputer is configured to, based on the at least a part of the panel being separated from the body while the operation of the motor is stopped, output the notification signal in response to the opening of the switch caused by a separation of the panel.

6. The circuit assembly of claim 1, wherein
   the first circuit is a driven circuit which is independent of a control signal outputted by the microcomputer.

7. The circuit assembly of claim 1, wherein
   the microcomputer is configured to stop the operation of the motor by transmitting the control signal including a high signal to the OR gate, and the first circuit is a driven circuit.

8. The circuit assembly of claim 1, wherein
   the first circuit is connected to a low voltage ground, and the second circuit is connected to a high voltage ground.

9. The circuit assembly of claim 1,
   wherein the OR gate is configured to stop the operation of the motor by outputting a high signal having a same potential as the light emitting element.

* * * * *